US006882242B2

(12) United States Patent
Nelson

(10) Patent No.: US 6,882,242 B2
(45) Date of Patent: Apr. 19, 2005

(54) FREQUENCY SELECTIVE LOW LOSS TRANSMISSION LINE SYSTEM

(75) Inventor: James W Nelson, Cheshire, CT (US)

(73) Assignee: Radio Frequency Systems, Inc., Meriden, CT (US)

( * ) Notice: Subject to any disclaimer, the term of this patent is extended or adjusted under 35 U.S.C. 154(b) by 106 days.

(21) Appl. No.: 10/464,731

(22) Filed: Jun. 19, 2003

(65) Prior Publication Data

US 2004/0257169 A1 Dec. 23, 2004

(51) Int. Cl.[7] .................................................. H03H 7/38
(52) U.S. Cl. .......................... 333/35; 333/260; 439/578
(58) Field of Search .............................. 333/33–35, 26, 333/245; 439/578–585

(56) References Cited

U.S. PATENT DOCUMENTS

| | | | |
|---|---|---|---|
| 2,490,622 A | 12/1949 | Cork | |
| 3,492,604 A | 1/1970 | Fan | |
| 3,681,718 A | 8/1972 | Kozul et al. | |
| 4,153,885 A | 5/1979 | Bacher | |
| 4,358,174 A | 11/1982 | Dreyer | |
| 4,675,633 A | 6/1987 | Young | |
| 5,198,786 A | 3/1993 | Russell et al. | |
| 5,327,111 A | 7/1994 | Gipprich | |
| 5,463,405 A | 10/1995 | Liu et al. | |
| 5,532,657 A | 7/1996 | Stoehr et al. | |
| 6,398,584 B1 * | 6/2002 | Hua et al. | 439/578 |
| 6,462,637 B1 * | 10/2002 | Laverick | 336/107 |
| 2001/0032731 A1 | 10/2001 | Badii et al. | |

* cited by examiner

*Primary Examiner*—James H. Cho
(74) *Attorney, Agent, or Firm*—Sughrue Mion, PLLC; Tom Gellenthien; V. Lawrence Sewell

(57) ABSTRACT

A frequency selective low loss transmission system for communicating a signal using a coaxial cable of one impedance to a device of different impedance. A connector with a matching transformer is integral to the connector which terminates with a standard interface. The invention also includes a coupling mechanism to couple the coaxial cable with the connector. The invention can also include series open stub conductors for capacitive coupling to the conductors of the coaxial cable. In addition to low losses over a broad frequency range, the connector facilitates connector installation due to the series open stub conductor while reducing cost and complexity of both coaxial cable and connector.

25 Claims, 7 Drawing Sheets

FREQUENCY SELECTIVE LOW LOSS TRANSMISSION LINE SYSTEM

BACKGROUND OF THE INVENTION

1. Field of the Invention

This invention relates to a transmission line system that is optimized for low loss. More particularly, the invention relates to a transmission line system and a connector for communicating a coaxial cable of one impedance with a device of another impedance with low losses.

2. Description of the Related Art

A communication industry transmission standard is a 50 ohm impedance for communication systems. A 75 ohm coaxial transmission cable, however, has lower attenuation characteristics and a higher operating frequency than a 50 ohm coaxial transmission cable, thus making the 75 ohm transmission cable a better choice for some broadcast applications and CATV industries. To employ a transmission cable with higher impedance, broadcast systems may require separate matching transformers to convert the impedance back to a typical 50 ohm device and CATV systems require 75 ohm mating connectors and amplifiers to integrate the 75 ohm cables into the respective systems. One specific application is the use of telecommunication cables in the PCS band for mobile telephones. The frequency band for this service is 1850 to 1990 MHz in the United States. This band involves very high frequencies, but not high enough to justify the cost of waveguides or tower loading to lower the attenuation. Therefore, a system is desired that reduces signal loss while having low product and implementation cost.

SUMMARY OF THE INVENTION

The present invention is directed to a communication system comprising a signal on a coaxial transmission line which provides lower attenuation given the frequency of the signal, and a mating connector. The connector includes an integral connector transformer with optimized impedance for matching a low loss cable such as the 70 ohm coaxial transmission line to 50 ohm devices through an interface. The 70 ohm transmission cable typically includes low-density foam and a smooth hollow tube center conductor. A corrugated tube or solid wire could be used depending on the overall diameter of the cable. The outer conductor of the cable is typically made of an annular corrugated copper tube configured to simplify connector installation and provide flexibility. Other designs for the outer conductor are possible, designs such as smooth or helical corrugations. The connector includes means for attaching the connector to the cable as will be discussed further.

In one embodiment, the connector comprises an integral quarter wave transformer designed for the desired frequency of operation and standard means of attaching the connector to cable conductors by providing electrical contacts. In another embodiment, there is a series quarter wave open circuit inner stub that capacitively couples to the hollow center conductor of a coaxial transmission line, along with an integral transformer. Alternatively, the stub is reversed for a solid center conductor with a hollow center conductor of the connector. In yet another embodiment, there is an integral transformer and a series quarter wave open circuit outer stub that capacitively couples to an outer conductor of a coaxial transmission cable. Additionally, there is an embodiment which includes both a series quarter wave open stub inner conductor, a series quarter wave outer conductor, and an integral quarter wave transformer.

The use of the series quarter wave open stub conductors and the integral transformer provide additional tuning to allow a wider frequency band of operation and still have a Voltage Standing Wave Ratio, or VSWR, of less than 1.02:1.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENTS

Figure 1:
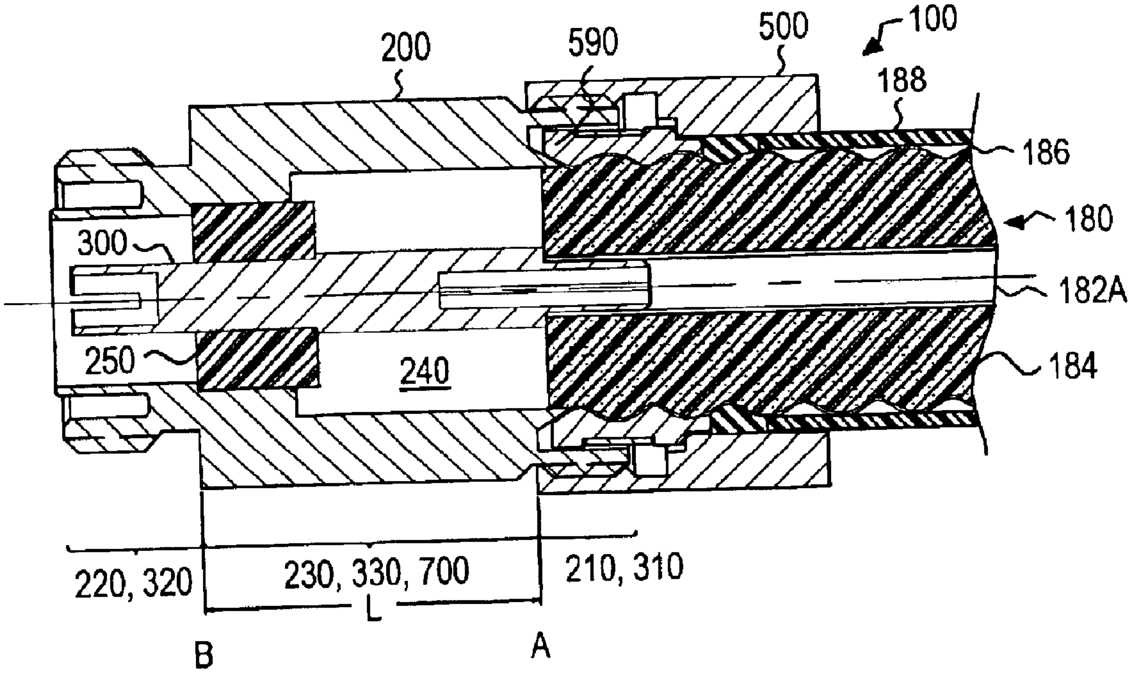
FIG. 1 is a cross sectional view of an embodiment of the invention using a connector coupling design incorporating an integral quarter wave transformer.

An exemplary first embodiment will now be described with reference to the drawings. A cross sectional view of a frequency selective low loss coaxial electrical connector 100 is shown in FIG. 1. The connector 100 is used to connect a first coaxial transmission line 180 with a first impedance to an electrical device (not shown) with a second impedance. By way of example, the first coaxial transmission line 180 has an impedance of 70 ohms and the electrical device is a second coaxial transmission line with the communication industry standard impedance of 50 ohms. The impedance of coaxial transmission line 180 is selected to provide the minimum attenuation depending on the construction and material used. It is noted that the first coaxial transmission line 180 and the electrical device can take on different impedance values than the ones above.

First coaxial transmission line 180 includes a typically smooth hollow tube center conductor 182A surrounded by an insulation 184 with a dielectric constant $\in_1$. The insulation 184 is made of any suitable dielectric, including, for example, solid polyethylene, foamed polyethylene, Teflon (polytetrafluoroethylene), fluorinated ethylene propylene, and foamed fluorinated ethylene propylene, or any material in combination with air. The choice of material and final foamed density will determine the dielectic constant and, therefore, the impedance that provides the lowest attenuation for a given size cable. The dielectric provides support to maintain the inner conductor on the axis of the cable. Surrounding the insulation 184 is an outer conductor 186. The outer conductor 186 is typically made of an annular corrugated copper sheet to provide flexibility and ease in attaching standard connectors. Surrounding the outer conductor 186 is a protective cover 188.

First coaxial transmission line 180 is coupled to the connector 100. The connector 100 comprises a substantially cylindrical body 200 having a spaced first end portion 210, second end portion 220, and an elongate center portion 230 including a transformer section 700. It is noted that the substantially cylindrical body 200 is electrically conductive. The elongate center portion 230 is disposed between the first end portion 210 and the second end portion 220, and has an axial bore 240 therethrough. Additionally, there is a dielectric bead 250 with a dielectric constant $\in_2$ fixed inside the axial bore 240 at an end of the center portion 230. As with the insulation 184 of the first coaxial cable 180, the dielectric bead 250 is made of any suitable dielectric, including, for example, solid polyethylene, foamed polyethylene, Teflon, fluorinated ethylene propylene, and foamed fluorinated ethylene propylene. By way of example, the dielectric bead 250 is made of solid Teflon. The bead 250 may or may not be part of transformer section 700.

There is a metal member 300 within the dielectric bead 250 and extending coaxially within the axial bore 240. The metal member 300, which is an inner conductor of the connector 100, has first and second end portions 310 and 320 corresponding to the first and second end portions 210 and 220 of the cylindrical body 200, and a center portion 330 corresponding to the center portion 230 of the cylindrical body 200. In the axial bore 240, the metal member 300 is fixed in place and electrically insulated from the cylindrical body 200 by the dielectric bead 250. The first end portions 210 and 310 interfit with the first coaxial transmission line 180.

Specifically, the first end portion 210 of the cylindrical body 200 mates with the outer conductor 186 in metal-to-metal electrical contact through a clamping ferrule 590, and spring-type contacts of the first end portion 310 of the metal member 300 mates with the center conductor 182A in metal-to-metal electrical contact. There are numerous standard means in the art to connect cable and connectors in metal-to-metal electrical contact that will not be described in detail.

Further, there is a coupling mechanism 500 to mate the coaxial transmission line 180 to the cylindrical body 200. It is noted that there are numerous standard means in the art to couple cables and connectors, and they will not be described.

The second end portions 220 and 320 are shaped to interfit or mate with an electrical device. By way of example, the second end portions 220 and 320 comprise a standard 7-16 DIN-type cable interface to interfit with the electrical device. In another configuration, the second end portions 220 and 320 comprise a standard N-type cable interface (not pictured).

The center portions 230 and 330, and the dielectric bead 250 cooperatively provide for a transformer impedance for matching the first impedance of the first coaxial transmission line 180 and the second impedance of the electrical device. To provide a matching impedance, the connector 100 has a characteristic impedance calculated by EQN. 1 below.

$$Z_{char}=\sqrt{Z_i \cdot Z_o} \qquad \text{EQN. 1}$$

wherein $Z_{char}$ is a characteristic impedance of the transformer section in the connector, $Z_i$ is an impedance of a coaxial transmission line; and $Z_o$ is an impedance of an electrical device.

In other words, the maximum power is transferred when the load impedance, i.e., impedance of the electrical device, is the complex conjugate of the source impedance, i.e., impedance of the coaxial transmission line.

For the first embodiment, $Z_{char}$ is the transforming impedance of the connector 100, $Z_i$ is the impedance of the first coaxial transmission line 180, and $Z_o$ is the impedance of the electrical device 900.

The characteristic impedance of a electrically conducting coaxial body is given by EQN. 2.

$$Z_{char}=\frac{138}{\sqrt{\varepsilon}}\cdot\log\left(\frac{D}{d}\right) \qquad \text{EQN. 2}$$

wherein D is an inside diameter of an outer conductor, d is an outside diameter of an inner conductor, and $\in$ is a dielectric constant of a dielectric between the inner and the outer conductors.

By way of example, the inside diameter of the center portion 330 is D and the outside diameter of the center portion 230 is d. The dielectric constant of air surrounding the center portion 230 is $\in$. Applying EQN. 2 to the center portions 230 and 330, and taking into account an impedance imparted by the dielectric bead 250, provide the relationships between some of the physical dimensions of the center portions 230 and 330. For example, a D substantially equivalent to the diameter of the outer conductor 186 of the first coaxial transmission line 180, results in a center portion 330 of the metal member 300 having a d different than the outside diameter of the center conductor 182A to provide for a $Z_{char}$ satisfying EQN. 1, when using a 70 ohm coaxial transmission line and a 50 ohm electrical device. Alternatively, the center portions 230 and 330 may have different configurations as long as their respective dimensions satisfy EQNS. 1 and 2.

In other words, center portions 230 and 330, and the dielectric bead 250 comprise a matching transformer section 700. As shown in FIG. 1, the components of the matching transformer section 700, i.e., center portions 230 and 330, and the dielectric bead 250 are integral to the connector 100.

To minimize signal losses in the connector 100, a transforming length L including the center portions 230 and 330, and the dielectric bead 250 has a value depending on the frequency of the signal carried in the connector 100. Electrically, the distance of the transforming length L is from a first impedance transition A between the first impedance and the matching impedance, to a second impedance transition B between the matching impedance and the second impedance. For the embodiment shown in FIG. 1, the first impedance transition A is at the abutting terminal end of the first coaxial transmission line 180 and the second impedance transition B is at a side of the dielectric bead 250 abutting the second end portions 220 and 320.

By way of example, a 1920 GHz signal requires a transforming length L of 1.014 inches with solid polyethylene filling the complete cavity of transformer length. In comparison, a connector without the dielectric bead 250 included in the transformer length L of one quarter wavelength in air, requires a length of 1.475 inches for a 1920 GHz signal. In effect, the presence of the dielectric bead 250 allows for a shorter transforming length L and therefore a shorter connector. The final length of bead or percentage of dielectric will be determined by mechanical integrity and cost.

By way of example, a quarter wave transformer can provide a VSWR of approximately 1.02:1 for a signal in the frequency band of 1850 to 1990 MHz. VSWR is the result of reflected waves, and a lower VSWR ratio translates into lower levels of undesirable signal reflections resulting from the connection of transmission lines or devices with mismatched impedance. It is noted that in another configuration (not pictured), the transforming length L can comprise an integral multiple of quarter wavelengths depending on the desired bandwidth.

Figure 2:
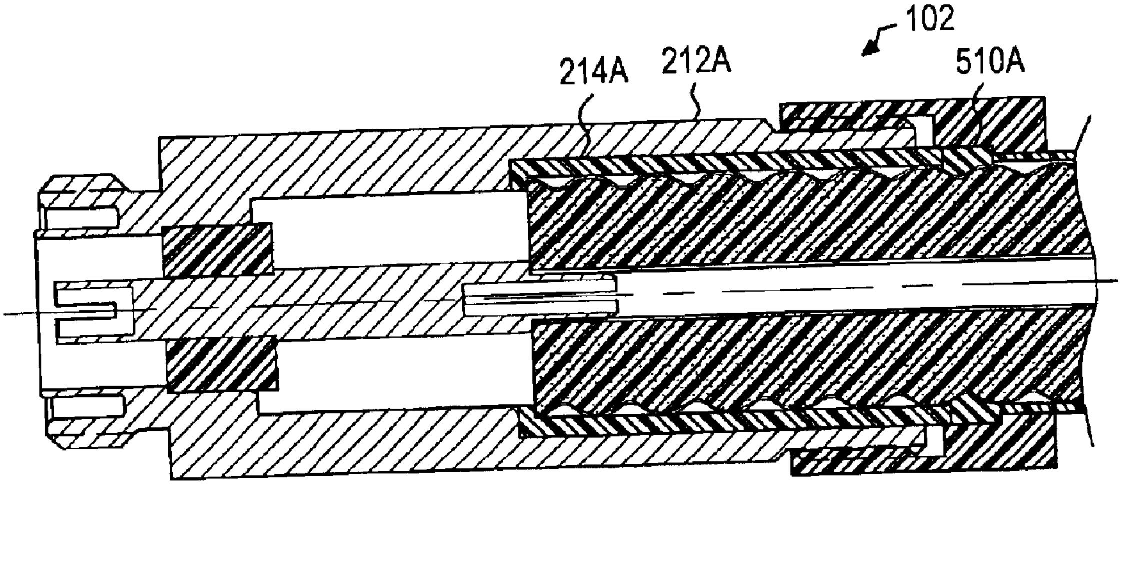
FIG. 2 is a cross sectional view of an embodiment of the invention showing a series open circuit outer stub.

FIG. 2 illustrates another embodiment of the invention. With respect to the embodiment shown in FIG. 1, this embodiment differs in the following. Instead of a first end portion 210 of the cylindrical body 200 in electrical contact with the outer conductor 186 (FIG. 1), there is a series open circuit outer stub 212A capacitively coupled to the outer conductor 186. The capacitive coupling is created by the larger inside diameter of the first end portion 210 of the cylindrical body 200 of the connector 100 surrounding the cable 180. This cavity is preferably lined with a dielectric lining 214A to maintain the proper alignment of components between the series open circuit outer stub 212A and the outer conductor 186 and to prevent electrical contact. The dielectric lining 214A is made of a suitable dielectric material such as polyethylene.

Additionally, the embodiment includes a resilient gland 510A disposed at a distal end of the dielectric lining 214A. Specifically, the coupling mechanism 500 has a hollow inner cavity and a step along the inner surface of the hollow inner cavity in which the resilient gland 510A is disposed. When the connector 102 is coupled to the cable 180, i.e., when the coupling mechanism 500 is tightened with respect to the cylindrical body 200 and the cable 180, the resilient gland 510A is compressed. As the resilient gland 510A is compressed, the gland 510A deforms, and protrudes into a corrugation of the outer conductor 186. In such an arrangement, the resilient gland 510A grips the corrugated outer conductor 186 of the coaxial transmission line 180 to hold the same in place and provides a moisture barrier.

Figure 3:
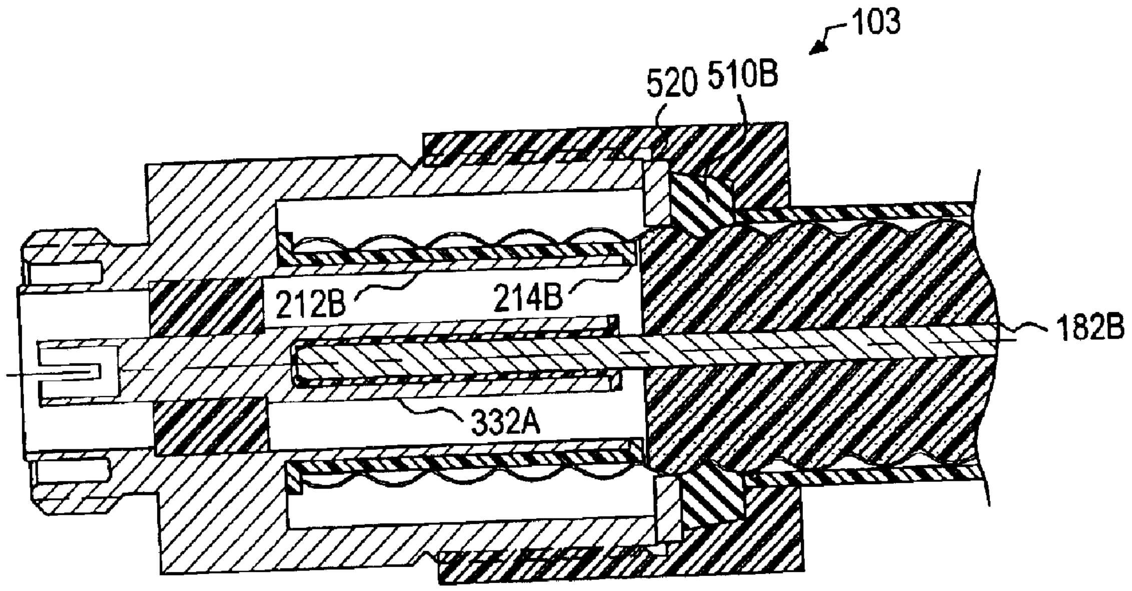
FIG. 3 is a cross sectional view of an embodiment of the invention showing a series open circuit outer stub disposed inside the outer conductor of the coaxial transmission line.

Another embodiment of the invention is shown in FIG. 3. This embodiment differs with respect to the embodiment shown in FIG. 2 in the following. Capacitive coupling is created by an inner diameter of the outer conductor 186 of the coaxial cable 180 that is larger than the outside diameter of an open circuit outer stub 212B of a connector 103. Similar to the embodiment described in FIG. 2, the open circuit outer stub 212B is preferably covered with a dielectric 214B to maintain the proper alignment of the components. In this embodiment, the outer body of the cylindrical body 200 is substantially spaced apart from the cable outer conductor and the series open circuit outer stub 212B to create a quarter wave choke. In this embodiment, the center conductor 182B of the coaxial transmission line 180 is solid and in electrical contact with a center portion 332A of a metal member 300.

This stub design requires a special tool to cut the cavity in the foam 184. This type of tool is common in CATV cable connector installation. Alternatively, in another embodiment, the series open circuit outer stub 212B is designed to cut the cavity into the foam 184 to eliminate the need for a special tool.

Additionally, there is a conductive member 520 disposed between the resilient gland 510B and a distal end of the outer body the connector 103. The conductive member 520 provides a more effective open circuit outer stub 212B by creating an electrical contact between the outer conductor 186 of the cable 180, the outer surface of the cylindrical body 200, i.e., the outer body of the connector. The resilient gland 510B in this case is conductive to provide electrical contact to the cable 180.

Figure 4:
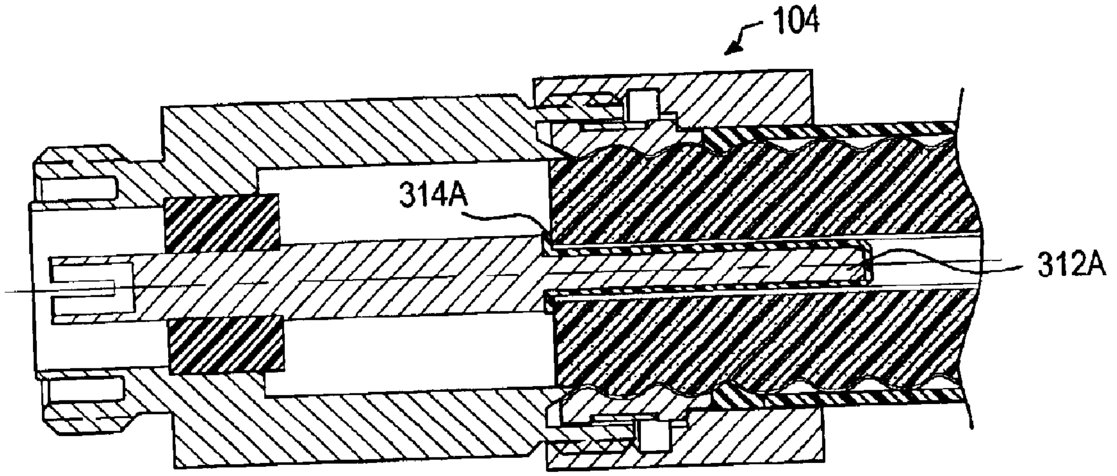
FIG. 4 is a cross sectional view of an embodiment of the invention showing a series open circuit inner stub.

FIG. 4 illustrates another embodiment of the invention. This embodiment of the connector 104 differs from the embodiment shown in FIG. 1 in the following regard. Instead of a first end portion 310 of the metal member 300 in electrical contact with the center conductor 182A (FIG. 1), there is a series open circuit inner stub 312A capacitively coupled to the center conductor 182A. In this embodiment, the outer diameter of the series open circuit inner stub 312A is less than the inside diameter of the hollow cavity in the center conductor 182A. Preferably, there is a dielectric sleeve 314A of suitable material such as polyethylene to maintain the series open circuit inner stub 312A in proper alignment with respect to the center conductor 182A and to prevent electrical contact.

Figure 5:
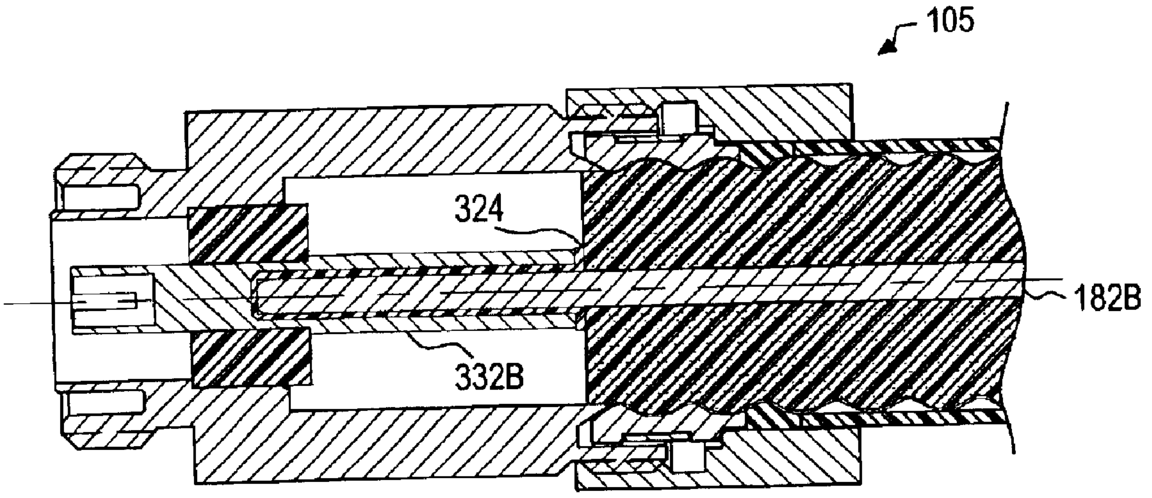
FIG. 5 is another configuration of the series open circuit inner stub.

Alternatively, an another embodiment is shown in FIG. 5. This embodiment is different from the embodiment shown in FIG. 1 with respect to the following. In a connector 105, there is a series open circuit inner stub 332B at the center portion 330 of the metal member 300. The series open circuit inner stub 332B has a hollow cavity in which a projecting solid end portion of an inner conductor 182B of the coaxial transmission line 180 is disposed. The inside diameter of the hollow cavity is greater than the outer diameter of the solid inner conductor 182B. A dielectric lining 324 is preferably disposed on the inside surface of the hollow cavity to maintain proper alignment of the components and to prevent electrical contact. This design is applicable to smaller cables that are made with solid center conductors.

Figure 6:
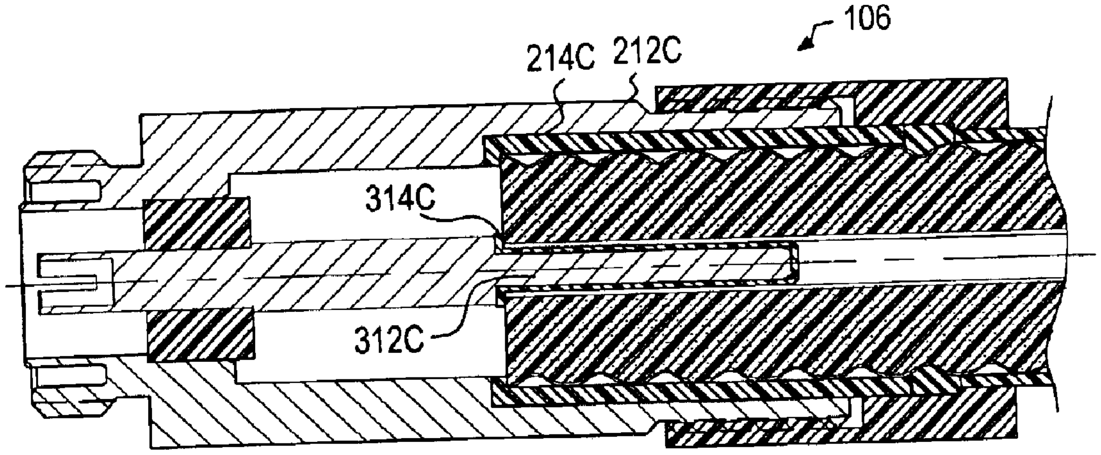
FIG. 6 is a cross sectional view of an embodiment of the invention comprising a series open circuit outer and inner stubs.

FIG. 6 illustrates yet another embodiment of the invention. With respect to the embodiment shown in FIG. 2, this embodiment differs in the following respect. This embodiment combines the inner capacitive coupling configuration shown in FIG. 4 with the outer capacitive coupling configuration shown in FIG. 2. In the connector 106, the impedance property of each of the two stubs 212C, 312C will normally need to be modified when the two stubs are combined to maintain the correct impedance to conjugate the reactance of the transformer section 700 over the desired bandwidth.

Figure 7:
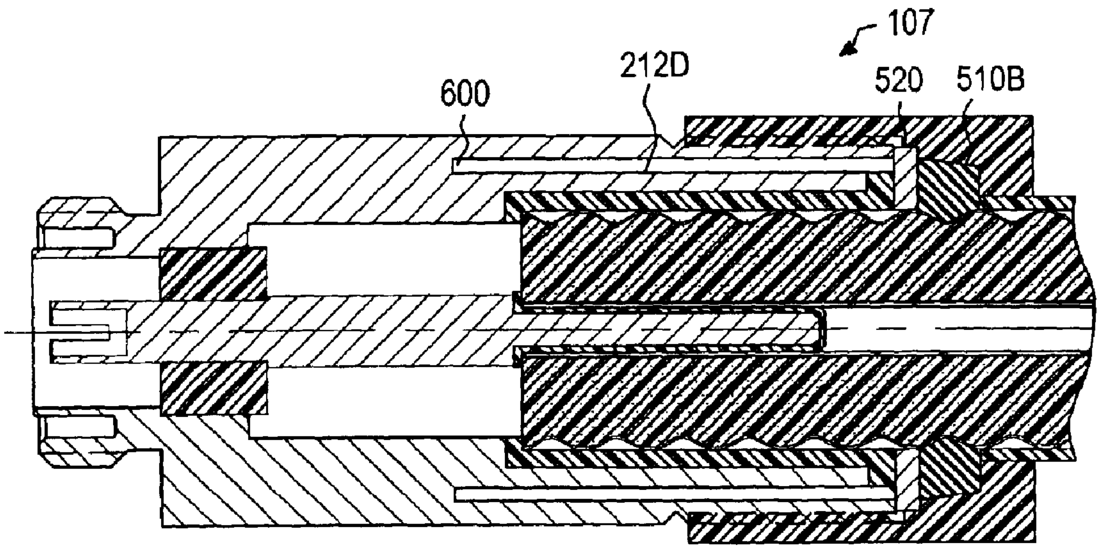
FIG. 7 is a cross sectional view of an embodiment of the invention showing series open circuit outer and inner stubs, and an outer conductor choke.

To impede the flow of radiation and current toward the outside of the outer stub, a yet another embodiment of the invention is shown in FIG. 7. This embodiment differs from the embodiment described in FIG. 6 with respect to the following. Radially around the series open circuit outer stub 212D, there is an outer choke 600, i.e., a short circuit stub. Preferably, the choke 600 is a dielectric layer such as an air gap, preferably, or a dielectric sleeve, that is disposed within first end portion 210 of the cylindrical body 100 of the connector 107. With an air gap, the choke 600 is physically longer than quarter wavelength dielectric loaded stub. Further, the embodiment includes the conductive member 520 and conductive gland 510B. The conductivity of the gland 510B need not be high since the gland 510B is disposed at a high-impedance position where low current exists. In an alternative embodiment, the resilient gland 510B may replace the conductive member 520 depending on the conductivity of the resilient gland 510B.

In all the embodiments shown in FIGS. 2–7, the length of the series open stub inner conductors and the series open stub outer conductors is electrically one quarter wave long. By way of example, if the dielectric lining 214C and the dielectric sleeve 314C shown in FIG. 4 are made of polyethylene, the quarter wave in polyethylene is 1.014 inches long for a 1920 MHz signal. In such a configuration, the inner stub can provide less than 10 ohm impedance and the outer stub will be approximately 25 ohms impedance with a corrugated outer conductor. The exact physical length of the stub is usually determined by test since the volume of cavity created by conductors and connector is a combination of dielectric and air to maintain the slip fit requirement for field installation of connector.

The cable of the present invention has low losses given the state of the art of the materials for cables such as foam polyethylene with densities below 0.18 g/cm utilized to effect the invention. The use of at least one series open circuit stub conductor as in FIGS. 2–7 provides improved bandwidth characteristic over a connector using only a simple quarter wavelength transformer (FIG. 1). For example, the series open stubs and the integral transformer as shown in FIG. 6 of the present invention allows for a greater bandwidth covering the worldwide PCS band of 1700 to 2300 MHz with a VSWR of less than 1.02:1. On the other hand, a connector without the series open stubs, i.e., embodiment shown in FIG. 1, covers a frequency band of 1850 to 1990 MHz with a VSWR of about 1.02:1.

Physically, the incorporation of the series open stub conductor allows for simplified connector installation by allowing for less precise cutting of the coaxial transmission cable and less critical torque requirements to install the connector. The utilization of a non-metallic connector contact through the use of a dielectric sleeve allows the connector to be hand tightened. Furthermore, capacitively coupling both inner and outer conductors eliminates all passive intermodulation (PIM) from the most likely source while eliminating the most expensive and complicated parts of the connector.

In use, the connector only needs to be hand tightened to properly connect the coaxial transmission line to the connector because the use of open circuit stubs reduce the need for precise electrical metal to metal contact between the coaxial transmission line and the connector.

The invention is described in terms of the above embodiments which are to be construed as illustrative rather than limiting, and this invention is accordingly to be broadly construed. The principle upon which this invention is based can also be applied to other frequency bands of interest.

It is contemplated that numerous modifications may be made to the present invention without departing from the spirit and scope of the invention as defined in the following claims.

What is claimed is:

1. A coaxial electrical connector for mating a coaxial transmission line of first impedance having a center conductor and an outer conductor with an electrical device of second impedance, said connector comprising:

a substantially cylindrical outer conductor having spaced first and second end portions, and an elongate center portion intermediate said end portions, said cylindrical outer conductor having an axial bore therethrough;

a dielectric insulator fixed within said bore at said center portion;

a coupling mechanism mating said first coaxial transmission line to said substantially cylindrical outer conductor; and an inner conductor within said insulator and extending coaxially within said bore, said inner conductor having first and second end portions corresponding to said first and second end portions of said cylindrical outer conductor and a center portion corresponding to said center portion of said cylindrical outer conductor, said first end portions interfitting with the coaxial transmission line such that said first end portion of said inner conductor mates with the center conductor, and said first end portion of said cylindrical outer conductor mates with the outer conductor, and said second end portions being mateable with the electrical device, wherein the substantially cylindrical outer conductor, inner conductor, and the dielectric insulator cooperatively provide for a transformer impedance for matching the first and second impedance, and wherein a transforming length of said center portions comprising a distance from a first impedance transition between the first impedance and the transformer impedance to a second impedance transition between the transformer impedance and the second impedance.

2. The coaxial electrical connector of claim 1, wherein the dielectric insulator comprises a dielectric bead and the transforming distance is from an abutting terminal end of the coaxial transmission line to an end of the dielectric insulator abutting the second portion.

3. The coaxial electrical connector of claim 1, wherein the transforming length of said center portions is substantially equivalent to an integral multiple of a quarter wavelength of a signal in the connector.

4. The coaxial electrical connector of claim 1, wherein the transforming length of said center portions is substantially equivalent to a quarter wavelength of a signal in the connector.

5. The coaxial electrical connector of claim 1, wherein the transforming length of said center portions is predetermined to minimize a variable standing wave ratio in said center portion to approximately 1.02:1 for signals in the frequency band of 1850 to 1990 MHz.

6. The coaxial electrical connector of claim 1, wherein at least one of said first end portions of said inner conductor and cylindrical outer conductor is capacitively coupled to the center conductor and to the outer conductor of the coaxial transmission line, respectively.

7. The coaxial electrical connector as claimed in claim 1, said connector further comprising at least one of an inner dielectric capacitively coupling a series open circuit inner stub to the center conductor of the coaxial transmission line and an outer dielectric capacitively coupling a series open circuit outer stub to the outer conductor of the coaxial transmission line.

8. The coaxial electrical connector of claim 7, said connector comprising said outer dielectric capacitively coupling said series open circuit outer stub to said outer conductor of the coaxial transmission line, and further comprising an outer connector body, wherein a dielectric layer is disposed between said series open circuit outer stub and said outer connector body.

9. The coaxial electrical connector of claim 7, said connector comprising said series open circuit inner stub, said series open circuit outer stub, said inner dielectric, and said outer dielectric.

10. The coaxial electrical connector of claim 9 further comprising an outer connector body, wherein a dielectric layer is disposed between said series open circuit outer stub and said outer connector body.

11. The coaxial electrical connector of claim 7, wherein the transforming length of said center portions is predetermined to minimize a voltage standing wave ratio in said center portion for signals in the frequency band of 1700 to 2300 MHz.

12. The coaxial electrical connector of claim 1, wherein second portions comprise one of a standard N-type interface and a standard DIN 7-16-type interface.

13. A coaxial electrical connector for mating a coaxial transmission line of first impedance having a center conductor and an outer conductor with an electrical device of second impedance, said connector comprising:

a substantially cylindrical outer conductor having spaced first and second end portions, and an elongate center portion intermediate said end portions, said cylindrical outer conductor having an axial bore therethrough;

a coupling mechanism mating said first coaxial transmission line to said substantially cylindrical outer conductor;

a dielectric insulator fixed within said bore at said center portion; and an inner conductor within said insulator and extending coaxially within said bore, said inner conductor having first and second end portions corresponding to said first and second end portions of said cylindrical outer conductor and a center portion corresponding to said center portion of said cylindrical outer conductor, said first end portions interfitting with the coaxial transmission line such that said first end portion of said inner conductor mates with the center conductor, and said first end portion of said cylindrical outer conductor mates with the outer conductor, and said second end portions being one of N-type cable interface and DIN-7-16-type cable interface to mate with the electrical device, wherein the substantially cylindrical outer conductor, inner conductor, and the dielectric insulator cooperatively provide for a transformer impedance for matching the first and second impedance, and wherein a transforming length of said center portions comprises a distance from a first impedance transition between the first impedance and the transformer impedance to a second impedance transition between the transformer impedance and the second impedance, said transforming length substantially equivalent to an integral multiple of a quarter wavelength of a signal in the connector.

14. The coaxial electrical connector of claim 13, wherein the dielectric insulator comprises a dielectric bead and the transforming distance is from an abutting terminal end of the coaxial transmission to an end of the dielectric bead abutting the second end portions.

15. The coaxial electrical connector of claim 13, wherein at least one of said first end portions of said inner conductor and cylindrical outer conductor is capacitively coupled to the center conductor and to the outer conductor of the coaxial transmission line, respectively.

16. The coaxial connector as claimed in claim 13, said connector further comprising at least one of an inner dielectric capacitively coupling a series open circuit inner stub to the center conductor of the coaxial transmission line and an outer dielectric capacitively coupling a series open circuit outer stub to the outer conductor of the coaxial transmission line.

17. The coaxial electrical connector of claim 16, said connector comprising said series open circuit inner stub, said series open circuit outer stub, said inner dielectric, and said outer dielectric.

18. A coaxial electrical connector for mating a coaxial transmission line of a first impedance to an electrical device of a second impedance, said connector comprising:

a first connecting portion including a first inner conductor and a first outer conductor for respectively electrically coupling with center and outer conductors of the coaxial transmission line;

a second connecting portion including a second inner conductor and a second outer conductor for electrically coupling with the electrical device;

an insulating means for electrically isolating said second inner conductor from said second outer conductor; and a transformer means coaxially interposed between said first connecting portion and said second connecting portion and electrically coupled thereto for providing a matching impedance between the first impedance and the second impedance.

19. The coaxial connector of claim 18, wherein said transformer means comprising a length to minimize a variable standing wave ratio in said transformer means.

20. The coaxial connector of claim 19, wherein the coaxial connector further comprises at least one of:

a first capacitive coupling means for capacitively coupling said first inner conductor to the center conductor of the coaxial transmission line; and a second capacitive coupling means for capacitively coupling said first outer conductor to the outer conductor of the coaxial transmission line.

21. The coaxial connector of claim 20, said connector further comprising transmission line coupling means for coupling the coaxial transmission line to said connector.

22. The coaxial connector of claim 21, said second connecting portion comprising interfacing means for coupling said connector to the electrical device.

23. A system for communicating and conditioning a signal, said system comprising:

a coaxial transmission line of first impedance having a center conductor and an outer conductor;

an electrical device of second impedance; and a coaxial electrical connector comprising:

a substantially cylindrical outer conductor having spaced first and second end portions, and an elongate center portion intermediate said end portions, said cylindrical outer conductor having an axial bore therethrough;

a coupling mechanism mating said first coaxial transmission line to said substantially cylindrical outer conductor;

a dielectric insulator fixed within said bore at said center portion; and an inner conductor within said insulator and extending coaxially within said bore, said inner conductor having first and second end portions corresponding to said first and second end portions of said cylindrical outer conductor and a center portion corresponding to said center portion of said cylindrical outer conductor, said first end portions interfitting with the coaxial transmission line such that said first end portion of said inner conductor mates with the center conductor of the coaxial transmission line, and said first end portion of said cylindrical outer conductor mates with the outer conductor of the coaxial transmission line, and said second end portions being shaped to comprise one of N-type and DIN-7-16-type interface for communicating with the electrical device, wherein the substantially cylindrical outer conductor, inner conductor, and the dielectric insulator cooperatively provide for a transformer impedance for matching the first and second impedance, and wherein a transforming length of said center portions comprises a distance from a first impedance transition between the first impedance and the transformer impedance to a second impedance transition between the transformer impedance and the second impedance.

24. The system as claimed in claim 23, wherein said outer conductor of said coaxial transmission line comprises a corrugated shape and said center conductor of said coaxial transmission line comprises a hollow tube.

25. The system as claimed in claim 23, wherein said electrical device comprises a device transmission line for communicating the connector to the electrical device, the device transmission line having the second impedance.

* * * * *